United States Patent [19]

Pollard et al.

[11] Patent Number: 4,915,917

[45] Date of Patent: Apr. 10, 1990

[54] GLOW DISCHARGE UNIT

[75] Inventors: Thomas D. Pollard, Baltimore, Md.; Ueli Aebi, Bottmingen, Switzerland

[73] Assignee: The Johns Hopkins University, Baltimore, Md.

[21] Appl. No.: 16,570

[22] Filed: Feb. 19, 1987

[51] Int. Cl.$^4$ ............................................. B01J 19/08
[52] U.S. Cl. ......................... 422/186.05; 422/186.06; 422/907
[58] Field of Search ............. 422/907, 186.04, 186.05, 422/186.06, 186, 186.21

[56] References Cited

U.S. PATENT DOCUMENTS

| | | | |
|---|---|---|---|
| 2,395,062 | 2/1946 | Nielsen | 315/276 |
| 3,018,409 | 1/1962 | Berghaus et al. | 422/907 |
| 3,288,638 | 11/1966 | Van Paassen et al. | 422/186.05 |
| 3,471,396 | 10/1969 | Davidse | 422/186.05 |
| 3,859,535 | 1/1975 | Bartz | 422/186.05 |
| 4,115,168 | 9/1978 | Buonadonna et al. | 149/109.6 |
| 4,149,923 | 4/1979 | Uehara et al. | 422/186.05 |
| 4,307,283 | 12/1981 | Zajac | 422/186.05 |
| 4,341,582 | 7/1982 | Kohman et al. | 422/186.05 |
| 4,482,246 | 11/1984 | Meyer et al. | 219/121 PM |

*Primary Examiner*—John F. Terapane
*Assistant Examiner*—Susan Wolffe
*Attorney, Agent, or Firm*—Cushman, Darby & Cushman

[57] ABSTRACT

A glow discharge unit suitable for making surfaces such as carbon-coated electron microscopy grids and glass cover slips hydrophilic. The use of a vacuum leak detector (Tesla coil) in place of a conventional high voltage power supply and a small plastic desiccator for the vacuum chamber make the unit very inexpensive. Due to the small volume of the chamber and the simplicity of the unit, the whole glow discharge process can be carried out in only 2 to 3 min., a time considerably shorter than that required for conventional vacuum evaporators. The hydrophilic surfaces thus obtained improve adsorption of particles by several orders of magnitude in preparation for negative staining, freeze-drying and other procedures.

6 Claims, 1 Drawing Sheet

GLOW DISCHARGE UNIT

The present invention relates to an improved glow discharge unit suitable for use in making surfaces such as carbon-coated electron microscopy grids and glass cover slips hydrophilic.

The work described herein was supported by grants from the National Institutes of Health.

BACKGROUND OF THE INVENTION

Glow discharge in a reduced atmosphere of air has long been the accepted method to render carbon support films for electron microscopy (EM) hydrophilic (i.e. with a net negative charge) prior to adsorbing suspensions of biological material to them [c.f. Dubochet et al, J. Ultrastruct. Res. 35, 147–167, 1971]. This is commonly performed in a vacuum evaporator by placing the EM grid between two parallel electrode plates to which a high voltage is applied to cause a glow discharge.

While the prior techniques for rendering carbon support films or the like hydrophilic give useful results, there is still considerable room for improvement. For example, it would be desirable if glow discharge apparatus used to impart hydrophilicity could be made more convenient, faster and less expensive. This is the purpose of the present invention.

BROAD DESCRIPTION OF THE INVENTION

The invention provides a glow discharge unit for rendering carbon support films or the like hydrophilic which comprises a desiccator unit including upper and lower sections capable of being sealed to provide a vacuum chamber; means for reducing the pressure in the chamber; horizontally disposed upper and lower plate members within the chamber, the plate members being spaced apart and parallel to each other to provide a glow discharge zone therebetween, the upper plate member being held in fixed position while the lower plate member is adjustably mounted so as to permit adjustment in the spacing and consequent glow discharge zone between the plate members, the lower plate member including means for holding material to be made hydrophilic; high frequency vacuum tester means, particularly a Tesla coil, electrically connected to the upper plate member to provide the glow discharge between the plate members; means grounding the lower plate member; and means in the upper section for supplying a controlled amount of air into the chamber.

Advantageously the desiccator sections are made of suitable synthetic plastic materials, e.g. polycarbonate or polypropylene. The upper and lower section may be made from the same or different plastic material. Thus, for example, the upper section may comprise polycarbonate and the lower section may be polypropylene or polycarbonate. In some cases, however, for example, where temperatures close to the softening point of thermoplastics such as polypropylene or polycarbonate, are to be used, it is preferable for the sections to be made of glass. In any case, the desiccator should be electrically non-conductive.

The plates preferably comprise aluminum metal although other metals capable of providing and withstanding glow discharge may be used.

THE DRAWINGS

A preferred embodiment of the invention is disclosed in the accompanying drawings wherein.

DETAILED DESCRIPTION OF THE INVENTION

Figure 1:
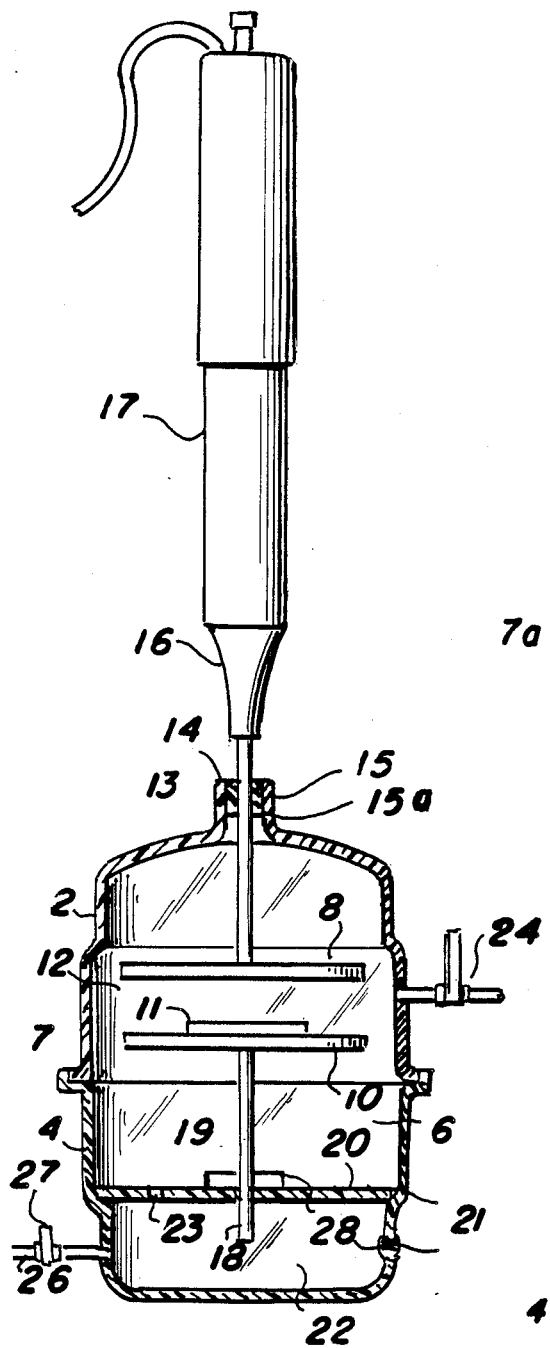
FIG. 1 is a vertical elevational view of the glow discharge unit with parts in section.
Figure 2:
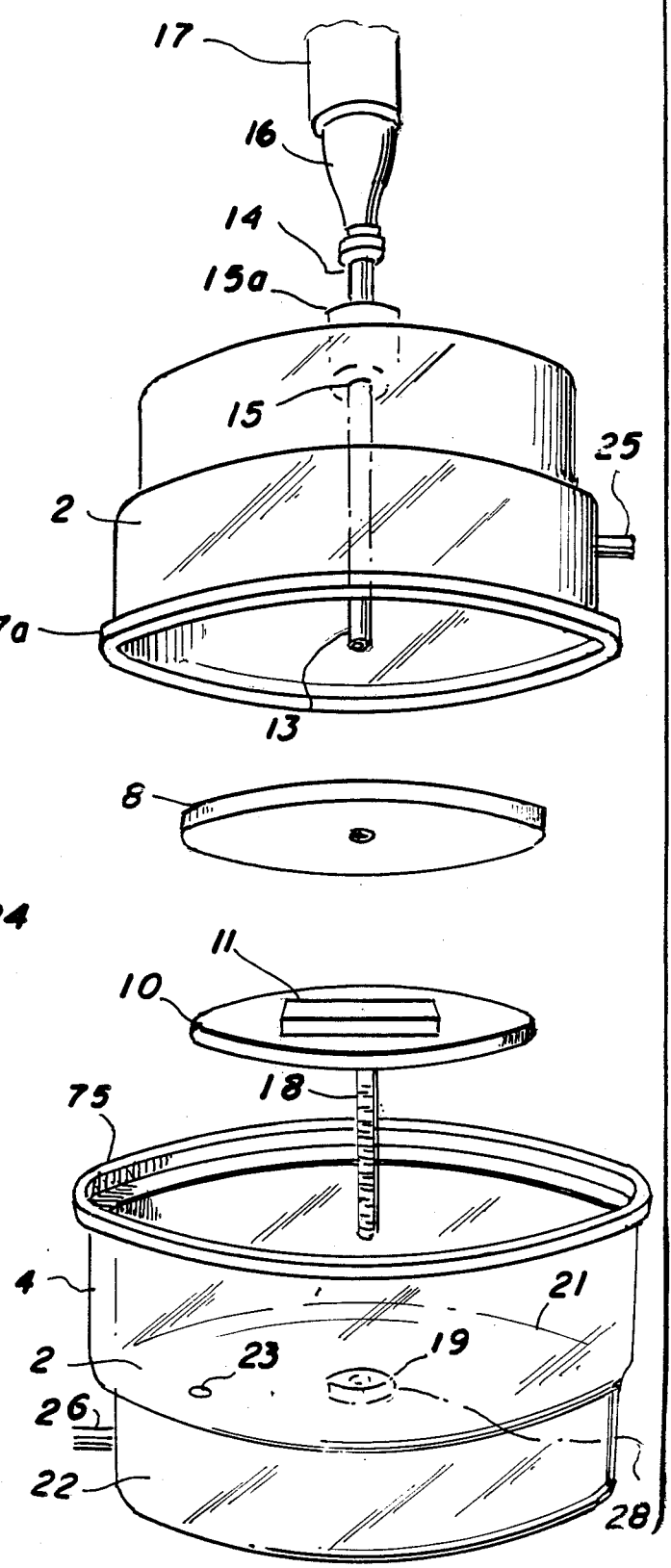
FIG. 2 is an exploded perspective view of the unit.

Referring more specifically to the drawings, the two sections (2) and (4), preferably of rigid plastic material, e.g. polycarbonate, form the desiccator vacuum chamber (6). Sections (2) and (4) may be hinged at one side (not shown) so that the chamber can be opened without completely separating the sections (2) and (4). However, This is not necessary, i.e. the sections (2) and (4) may be completely separate. In either case they should mate well as shown at (7), e.g. by providing the base of section (2) with a circumferential lip and o-ring 7(a) which fits into the circumferential recess 7(b) of bottom section (4). This permits an effective vacuum to be drawn in the vacuum chamber (6) when parts (2) and (4) are brought together.

The dimensions of the vacuum chamber (6) can be varied. However the chamber should be large enough to accommodate the upper and lower electrode plates (8) and (10) of conductive metal, preferably aluminum as noted earlier. The bottom electrode plate 910) is intended to receive and hold an EM grid carrier (11) which supports the EM grid subjected to glow discharge. Alternatively, the EM grid may be supported directly on the electrode plate (10).

As shown, the plates (8) and (10) are spaced apart to provide a glow discharge zone (12). This zone is adjustable by moving the lower plate (10) up and down as desired. The top plate (8) is held fixed in position by a rod (13) which may be made of aluminum or other conductive material. Rod (13) extends outwardly beyond the top section (2) of the desiccator, being held firmly in place by a plexiglass washer or the equivalent (14) fitted into the opening (15) in the top center portion of section (2).

The upper end of rod (13) is connected with the lower end (16) of a Tesla coil or like high frequency vacuum tester (17). Such testers are commercially available from, for example Electro Technic Inc.

The lower electrode plate (10) can be raised or lowered by mounting it on, for example, a threaded metal rod (18) of brass or the like which is threaded through a nut (19) or the like mounted on a circular ground plate (20) which is peripherally fitted at (21) to the interior of the lower desiccator section (4) and, preferably, but not necessarily, shaped to close off the bottom portion (22) of section (4) from the top portion. An aperture (23) is provided in plate (20) to permit equalizing the pressure above and below the ground plate (20). This aperture typically is about 5 mm in diameter.

The desiccator is provided with appropriate valve means (24), preferably in the form of a micrometer capillary valve or the like, to permit gas to be admitted into the chamber (6) via conduit (25), the latter being advantageously positioned in the side of the upper section (2) as shown. However, the positioning of the valve means (24) may be varied. Typically the value (24) is glued or otherwise fixed in an opening (e.g., 8–10 mm diameter) drilled in section (2).

A line (26) is also provided for connection with mechanical pump means (not shown) for evacuating the desiccator chamber (6). A needle valve (27) or the like is placed in line (26) to close off communication between the pump and chamber when this is desired. Typically this valve is glued or otherwise fixed in an appropriate opening (e.g. 10 mm diameter) in the lower section (4).

A copper ground wire or the like (28) extends from the ground plate (20) through the wall of section (4) for the purpose of grounding the assembly. Typically the ground wire (28) is placed in position by heating the wire and pushing it through the wall of the bottom section (4). The wire is then vacuum sealed to the section (4) by epoxy glue or the like and similarly fixed to the ground plate (20). Good grounding is particularly important for proper glow discharge.

It will be recognized from the foregoing that the size of the overall unit and its parts, as well as the materials used to make the same, can be widely varied. However, in one preferred arrangement, the plates (8) and (10) are round aluminum plates 100 mm in diameter and 6 mm thick; the ground plate (20) is a round plexiglass plate 140 mm in diameter; the rod (13) is an aluminum rod 11 mm in diameter and 150 mm long; the threaded rod (18) is a brass rod 12.5 mm in diameter and 75 mm long. Typically sections (2) and (4) form a plastic desiccator chamber (6) which averages about 149-150 mm in diameter, 206 mm high. The valves (24) and (27) advantageously comprise low density polyethylene.

As will be evident, the device of the invention comprises a desiccator of plastic or the like which provides a vacuum chamber (6) with plate members (8) and (10) suitably spaced to provide a glow discharge zone 912). EM grids are placed on the lower grounded plate 910) after which the chamber is partially evacuated by vacuum pump means through line (26) and valve (27). The pressure in chamber (6) after evacuation is, for example, $10^{-1}$ to $10^{-2}$ Torr. The high frequency vacuum tester (17) (Tesla coil or the like) is electrically attached to the top aluminum plate advantageously separated from the grounded plate (10) by 20-30 mm. In this way, there is provided a high voltage discharge of the residual air in the chamber. The vacuum line (26) to the pump is then closed by the needle valve (27) and air is admitted slowly to the chamber via the micrometric capillary valve (24).

The upper electrode (8) is advantageously press-fit onto the rod (13). The rod is fed through the hole (15) of appropriate size (e.g., 10-11 mm) drilled in the top center of the upper section (2) of the desiccator. The rod (13) is stabilized by the washer (14) which, for purposes of illustration could have an internal diameter of 10-11 mm and an outer diameter of 25 mm pushed into the neck (15) of the top section (2). This "feed-through" assembly may then be fastened to the top section (2) and vacuum-sealed with epoxy glue.

A simple direct drive vacuum pump or the equivalent may be used to evacuate the chamber, via valve (27) and conduit (26). To minimize backstreaming of oil vapour from the pump, a molecular sieve type of foreline trap or its equivalent may be put into the vacuum line between the pump and the vacuum chamber.

The device described above is operated as follows:

With the desiccator chamber 96) at atmospheric pressure, the needle valve (25) closed and the pump off, EM grids (or other objects to be treated such as glass coverslips) are placed on the grid carrier (11)), the latter preferably being scribed with one or more grooves to facilitate picking up the grids. While the upper section (2) of the vacuum-chamber is lifted up, the grid carrier is put onto the bottom electrode (10), then the upper section 92) is put back in place, and the micrometer capillary valve 924) closed. Next, the pump (not shown) is turned on and after about 5 sec. to allow evacuation of the line 926) between the pump and the vacuum-chamber (6), the valve (27) is opened to evacuate the chamber (6). After the pressure has reached $10^{-1}$ to $10^{-2}$ Torr (which is usually after about 1-2 min.), the Tesla coil or vacuum tester (17) is turned on with the output set to generate an intense purple-to-violet (i.e. ozone generating) glow discharge between the two parallel electrodes (8) and (10). The duration of the discharge is adjusted depending on the application. As an illustration, for carbon films on EM grids 5 to 15 sec. yield a surface that will adsorb an even distribution of particles during 30-60 sec. application of a 2.5 microliter drop of material having a particle concentration of 10-50 nanomolar. After glow discharge is completed, the valve (27) is closed and air admitted slowly (to prevent the grids from being blow away) to the chamber 96) through the micrometric capillary valve (24). Thereafter, the sections (2) and (4) are separated, the grid carrier is removed, the pump switched off, and the valve opened to ventilate the line between the pump and the vacuum-chamber (i.e. to prevent oil backstreaming into the vacuum line). The whole cycle of operation takes only 2 to 3 minutes.

The unit exemplified above may be used to render carbon coated EM grids hydrophilic for both negative staining and adsorption freeze-drying [c.f. Kistler et al, J. Ultrastruct. Res. 59, 76-86, 1977] of molecular and supramolecular suspensions. The desired effect is to make the surface of the specimen support film sufficiently charged that a thin aqueous film will spread evenly and dry down evenly over the entire surface, even when the bulk of the liquid is wicked away by touching a piece of filter paper to one edge. With support films treated in the glow discharge device, the concentration of macromolecular suspensions can typically be lower by 1-3 orders of magnitude compared with the concentration needed for sufficient adsorption to untreated films.

the present unit has been found to be faster and considerably less expensive than commercially available vacuum evaporators which are used for the same purpose. Some uses of the invention include preparation (i.e. by negative staining and/or freeze-drying/metal shadowing) of unaggregated actin filaments and actin filament paracrystals [Fowler and Aebi, 1982, 1983; Smith et al, 1984], crystalline actin sheets [Aebi et al, 1980, 1981], myosin filaments [Pollard, 1982], bundles of actin filaments from microvilli [Pollard and Mooseker, 1981p], intermediate-sized filaments [Aebi et al, 1983], and crystalline arrays of $Ca^{2+}$-ATPase [Buhle et al, 1983].

The glow discharge unit can be used to put either a positive or negative net charge on a surface. While in a reduced atmosphere of air, glow discharged carbon support films have a net negative charge, glow discharge in a reduced atmosphere of pentylamine results in a net positive charge of carbon support films [c.f. Dubochet et al, 1971 ↑]. This becomes particularly useful when trying to achieve protein-free (i.e. without cytochrome C) spreading of DNA such as in situations where one wants to visualize or map proteins (e.g. RNA polymerase, repressors, restriction endonucleases, etc.) bound to DNA [c.f. Williams, 1977; Brack and Pirotta, 1975; Brack et al, 1976]. Such positively charged support films can easily be prepared with the present glow discharge apparatus, simply by connecting the air inlet nozzle of the micrometric capillary valve to a bottle of pentylamine and properly adjusting the pentylamine vapour pressure in the vacuum-chamber with the capillary valve. It is noted, however, that pentylamine slowly but definitely attacks polycarbonate from which the desiccator sections, or one such section, e.g. the top (2), may be made. Thus if glow discharge in pentylamine is to be routinely employed, the chamber should be constructed from a glass desiccator or the like.

The present glow discharge unit can be used to treat glass cover slips to obtain spreads of chromosomes for light microscopy following the procedure described by Earnshaw and Migeon, (Chromosoma 92, 290–296, 1985).

It will be recognized from the foregoing that the invention provides a simple, inexpensive glow discharge unit that can be used to make surfaces such as carbon-coated electron microscopy grids and glass cover slips hydrophilic. The use of a vacuum leak detector (Tesla coil) in place of a conventional high voltage power supply and a small plastic desiccator for the vacuum chamber make the unit very inexpensive. Furthermore, because of the small volume of the chamber and the simplicity of the unit, the whole glow discharge process can be carried out in only 2 to 3 min., a time considerably shorter than that required for conventional vacuum evaporators. The hydrophilic surfaces thus obtained improve adsorption of particles by several orders of magnitude in preparation for negative staining, freeze-drying and other procedures.

The scope of the invention is defined in the following claims wherein:

We claim:

1. A glow discharge unit comprising a desiccator unit including upper and lower sections capable of being sealed to provide a vacuum chamber; means for reducing the pressure in said chamber; horizontally disposed upper and lower plate members within said chamber, said plate members being spaced apart and parallel to each other to provide a glow discharge zone therebetween, the upper plate member being held in fixed position while the lower plate member is adjustably mounted so as to permit adjustment in the spacing and consequent glow discharge zone between the plate members, said lower plate member including means for holding material to be made hydrophilic; high frequency vacuum tester means comprising a Tesla coil electrically connected to said upper plate member to provide said glow discharge between the plate members sufficient to render material in said holding means hydrophilic; means grounding said lower plate member; and means in said upper section for supplying a controlled amount of gas into said chamber.

2. A glow discharge unit according to claim 1 wherein the upper and lower sections of the desiccator are made of plastic.

3. A glow discharge unit according to claim 2 including a ground plate below the lower plate member dividing the lower section into a top portion and a bottom portion, said ground plate being apertured to equalize the pressure on both sides of said ground plate.

4. A glow discharge unit according to claim 3 wherein the plate members are made from aluminum.

5. A glow discharge unit according to claim 1 wherein the position of the lower plate member is adjustably mounted by means comprising a further plate member below the lower plate and parallel thereto, a rod movable vertically through said further plate member by rotating the rod, said rod supporting the lower plate member at its upper end and means adjacent said further plate for rotating said rod to lower or raise the same and thereby adjust the spacing between the upper and lower plate members.

6. A glow discharge unit according to claim 5 wherein the means for grounding the lower plate member are operatively connected to said further plate, said further plate divides the lower section of the unit into top and bottom portions and the further plate is apertured to equalize pressure on both sides thereof.

* * * * *